United States Patent
Choe et al.

(10) Patent No.: US 8,659,458 B1
(45) Date of Patent: Feb. 25, 2014

(54) MULTIPLE RETURN-TO-ZERO CURRENT SWITCHING DIGITAL-TO-ANALOG CONVERTER FOR RF SIGNAL GENERATION

(71) Applicant: Teledyne Scientific & Imaging, LLC, Thousand Oaks, CA (US)

(72) Inventors: Myung-Jun Choe, Thousand Oaks, CA (US); Kang-Jin Lee, Thousand Oaks, CA (US); Munkyo Seo, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/649,553

(22) Filed: Oct. 11, 2012

(51) Int. Cl.
*H03M 1/66* (2006.01)

(52) U.S. Cl.
USPC .......................................... 341/144; 341/153

(58) Field of Classification Search
USPC .................... 341/144, 136, 153, 135
See application file for complete search history.

(56) References Cited

U.S. PATENT DOCUMENTS

| 6,362,765 | B2 * | 3/2002 | Masuda ........................ 341/144 |
| 6,462,687 | B1 | 10/2002 | Eshraghi et al. .............. 341/143 |
| 6,476,748 | B1 * | 11/2002 | Galton .......................... 341/144 |
| 6,812,878 | B1 * | 11/2004 | Jewett et al. .................. 341/144 |
| 6,952,177 | B1 * | 10/2005 | Hitko ............................ 341/144 |
| 7,042,379 | B2 | 5/2006 | Choe ............................. 341/144 |
| 7,956,785 | B2 | 6/2011 | Baek et al. ................... 341/144 |
| 8,085,178 | B2 | 12/2011 | Turner et al. ................. 341/153 |

\* cited by examiner

*Primary Examiner* — Peguy Jean Pierre
(74) *Attorney, Agent, or Firm* — Koppel, Patrick, Heybl & Philpott

(57) ABSTRACT

A "multiple return-to-zero" (MRZ) current switching DAC. In operation, the outputs of respective current sources are selectively directed to respective intermediate nodes in response to respective control signals which vary with a digital input word, and in synchronization with a clock CK1. A plurality of MRZ current switches are connected between respective intermediate nodes and the DAC's analog output. The MRZ switches are driven with a clock CK2 which toggles in synchronization with CK1 at a frequency $f_{CK2}=N*f_{CK1}$. The MRZ switches are operated such that switching noise that arises when CK1 is asserted is prevented from appearing on the analog output. When properly arranged, the DAC can generate a direct digital waveform at RF frequencies, with N chosen to produce an output spectrum such that the DAC's output power is relatively high within the desired frequency range.

25 Claims, 8 Drawing Sheets

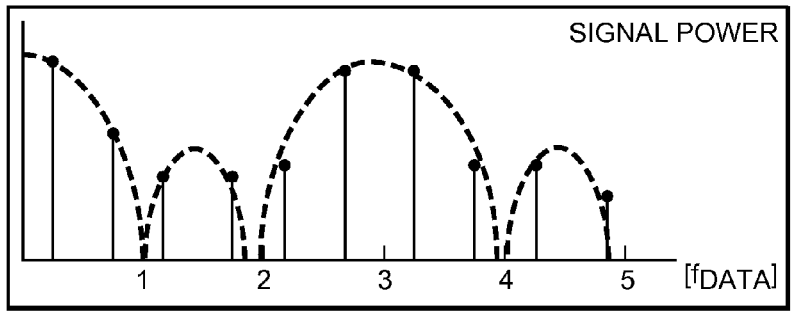
FIG. 3b
FIG. 3c
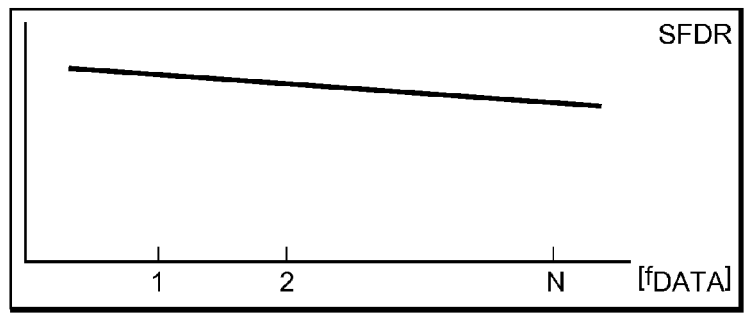
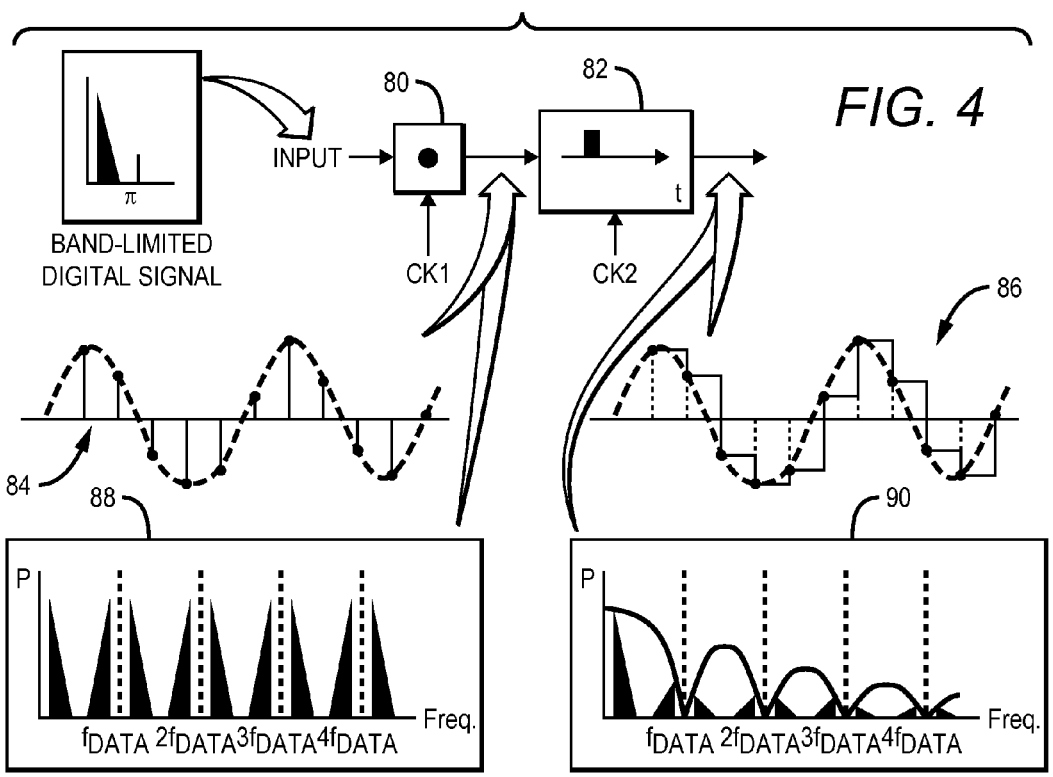
FIG. 4

MULTIPLE RETURN-TO-ZERO CURRENT SWITCHING DIGITAL-TO-ANALOG CONVERTER FOR RF SIGNAL GENERATION

BACKGROUND OF THE INVENTION

1. Field of the Invention

This invention relates to the field of digital-to-analog converters (DACs), and particularly to using current switching DACs to generate RF signals.

2. Description of the Related Art

A basic current switching DAC is shown in FIG. 1a. A plurality of current sources 10,12 are connected to analog output lines 14,16 via pairs of switches 18,20 and 22,24. The switches are typically implemented with transistors, which are controlled using respective control signals 26,28,30,32 provided by a latch circuit 34. Latch circuit 34 receives a digital input word via a set of input lines, as well as a clock signal.

The digital input word represents a desired analog output voltage. In operation, latch circuit 34 responds to an applied digital input word by setting control signals 26,28,30,32, thereby switching selected current sources to selected output lines as needed to obtain the desired analog output voltage. Latch circuit 34 is clocked, such that control signals 26,28, 30,32 change state in synchronization with the applied clock.

The DAC's operation is illustrated in the timing diagram shown in FIG. 1b. The diagram depicts the applied clock signal, along with an ideal DAC output 35, and an actual DAC output 36. As can be seen, the actual DAC output exhibits a considerable amount of noise; this is caused by switching slew and glitches which arise when the control signals change state, disconnecting some current sources from the analog output lines and connecting others. This non-linear source of error can result in an unacceptable level of distortion in the DAC output.

The operation of even an ideal DAC results in a frequency dependent attenuation of the DAC output; this is seen in the output spectrum shown in FIG. 1c. For a typical current switching DAC as shown in FIG. 1a, the DAC's output signal power falls off at a rate given by $$\frac{\sin(x)}{x},$$

where $f_{CLK}$ is the frequency of the applied clock signal and x is given by $$\frac{\pi * freq}{f_{CLK}},$$

where freq is the frequency of the DAC's analog output signal. This attenuation can necessitate the use of a correction filter, and can significantly limit the DAC's use in high frequency applications.

One approach to reducing noise caused by switching slew and glitches which arise when the current sources are switched is found in U.S. Pat. No. 6,812,878 to Jewett et al. As shown in FIG. 3 of Jewett, clocked resampling switches are interposed between the current source switches and the analog output lines. The resampling switches are operated such that the current source switches are temporarily disconnected from the analog output lines when the control signals change state, thereby preventing switching noise from reaching the output.

However, this approach also has drawbacks. For example, the resampling switches are implemented with transistors. Since the base nodes of the resampling switch transistors connected to the output line are clocked, clock noise can be coupled onto the analog output lines via the parasitic capacitances that exist across the terminals of the resampling switch transistors. In addition, in operation, the DAC's current sources are connected to ground for half of every switching cycle; as such, the DAC output power is half that of a conventional "non-return-to-zero" (NRZ) DAC, without any means to recover the lost power.

In some applications, it may be desirable to employ a DAC to generate RF signals. However, DAC output power is typically focused near DC, and the high-frequency images are either attenuated significantly or very poor in quality, and thus cannot be used. As such, generating RF signals with a DAC is typically accomplished using a low frequency DAC, the output of which must be filtered and up-converted with one or more mixers to create the RF signals.

SUMMARY OF THE INVENTION

A "multiple return-to-zero" (MRZ) current switching DAC is presented which overcomes the problems noted above, reducing switching- and clock-induced noise and extending the frequency range over which the DAC may be used, up to and including RF frequencies.

The present current switching DAC includes at least one analog output node which provides the DAC's analog output voltage, and a digital input which receives a digital input word representative of a desired analog output voltage. In operation, the outputs of respective current sources are selectively directed to respective intermediate nodes in response to respective control signals. The states of the respective control signals vary with the digital input word, and in synchronization with a first clock signal CK1.

The present DAC includes a plurality of "multiple return-to-zero" (MRZ) current switch circuits, connected between respective intermediate nodes and single or differential analog output nodes. The MRZ current switch circuits are driven with a second clock signal CK2 which toggles in synchronization with CK1 and preferably has an associated frequency $f_{CK2}$, where $f_{CK2}=N*f_{CK1}$ and N is a positive integer. The MRZ circuits are arranged such that the output currents applied to the intermediate nodes are connected to the analog output when CK2 is low, and disconnected from the analog output when CK2 is high, such that switching noise that arises when CK1 is asserted is prevented from appearing on the analog output.

When properly arranged, the present DAC can directly generate a digital waveform at RF frequencies. The RF frequencies are within a desired frequency range, with positive integer N chosen to produce an output spectrum for the DAC such that its output power is relatively high within the desired frequency range.

Further features and advantages of the invention will be apparent to those skilled in the art from the following detailed description, taken together with the accompanying drawings.

BRIEF DESCRIPTION OF THE DRAWINGS

FIG. 1b is a timing diagram for the known DAC shown in FIG. 1a.

FIG. 1c is an output spectrum diagram for the known DAC shown in FIG. 1a.

FIG. 2b is a schematic diagram of a portion of the MRZ DAC shown in FIG. 2a.

FIG. 3b is a plot of signal power vs. $f_{DATA}$ for the system of FIG. 3a.

FIG. 3c is a plot of SFDR vs. $f_{DATA}$ for the system of FIG. 3a.

FIG. 4 depicts time domain waveforms and frequency spectrum plots to illustrate the operation of an MRZ current switching DAC per the present invention.

FIG. 7b is a timing diagram which illustrates the operation of the DAC shown in FIG. 7a.

DETAILED DESCRIPTION OF THE INVENTION

The present current switching DAC is a high-speed, multi-Nyquist DAC capable of RF signal generation. Multiple return-to-zero (MRZ) current switch circuits are added to a current steering DAC to enable high frequency wideband applications.

Figure 1A:
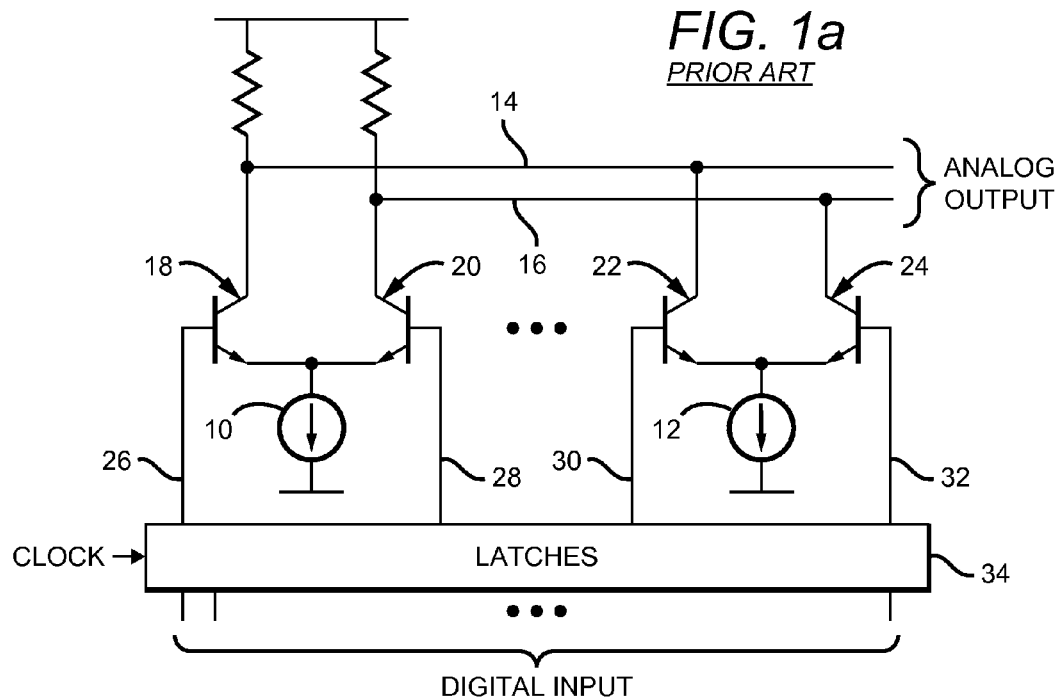
FIG. 1a is a block/schematic diagram of a known current switching DAC.
Figure 1B:
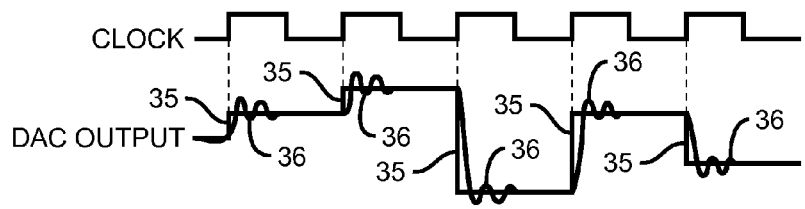
Figure 1C:
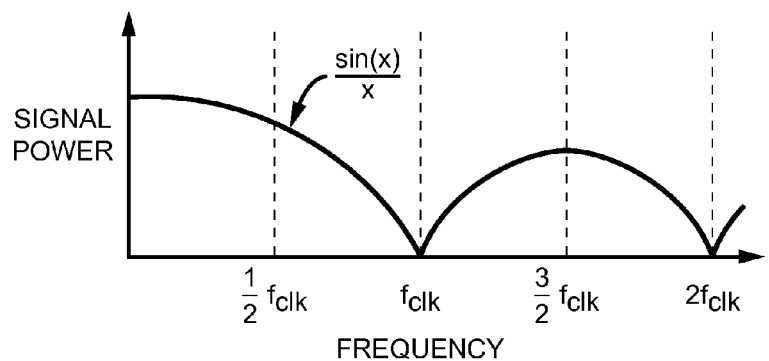
Figure 2A:
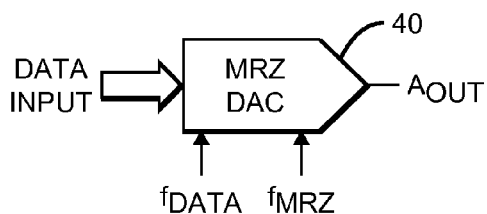
FIG. 2a is a block diagram of an MRZ current switching DAC per the present invention.
Figure 2B:
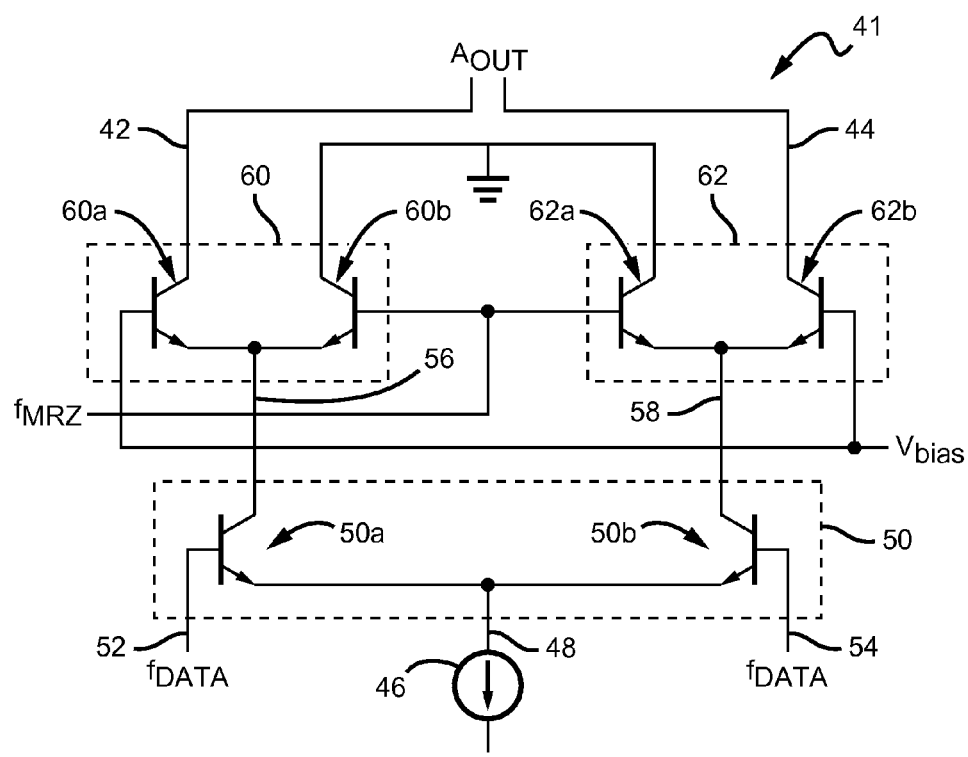

The basic principles of the present DAC are shown in FIGS. 2a and 2b. The DAC 40 receives a clock which operates at the frequency $f_{DATA}$ at which the analog data being converted is latched, and a clock which operates at a frequency $f_{MRZ}$ which operates the DAC's MRZ current switches; the DAC produces a differential analog output $A_{OUT}$.

An exemplary embodiment of a one-bit portion 41 of such a DAC is shown in FIG. 2b, which provides differential output $A_{OUT}$ on first and second analog output lines 42 and 44. The digital input word is received by clocked circuitry (not shown), typically a set of latches. The DAC includes a plurality of current sources; only one current source (46) is shown in FIG. 2b, but a practical DAC would typically include 10 or more current sources (as shown, for example, in FIG. 7). Current source 46 has an output 48.

In the differential embodiment shown, current source output 48 is connected to a "data current switch" 50. As used herein, a current switch comprises a current input, two current outputs, and two control signal inputs; a current applied to the current input is directed to one or the other of the two current outputs in response to control signals applied to the control signal inputs. Each current switch is typically implemented with two transistors, with their emitters (if bipolar) or sources (if FETs) connected to the current input, their collectors (or drains) connected to respective current outputs, and their bases (or gates) connected to respective control signal inputs 52, 54.

In the implementation shown in FIG. 2b, data current switch 50 comprises NPN transistors 50a and 50b. In a conventional current switching DAC, data current switch 50 would be connected between current source output 48 and analog output lines 42 and 44. Here, however, data current switch 50 is connected between current source output 48 and a pair of intermediate nodes 56 and 58. Transistors 50a and 50b direct current from current source output 48 to intermediate nodes 56 or 58, respectively, in response to respective control signals 52 and 54. The state of each control signal depends on the digital input word applied to the DAC. Control signals 52, 54 change state in synchronization with a clock signal (CK1) provided to the clocked circuitry at a frequency $f_{DATA}$, disconnecting some current sources from their intermediate nodes and connecting others. If the intermediate nodes were connected directly to the analog output lines, as in the prior art, switching noise might appear on the analog output lines when transistors 50a and 50b are turned on and off; i.e., in synchronization with CK1.

The invention overcomes this problem by interposing MRZ current switch circuits (60, 62) between respective intermediate nodes and analog output lines 42, 44. Each MRZ current switch circuit comprises a current switch made with two transistors: a first transistor connected between an intermediate node and an analog output line which is driven with a fixed bias voltage $V_{bias}$, and a second transistor connected between the intermediate node and a fixed voltage which is driven with a MRZ clock signal (CK2) having a frequency $f_{MRZ}$. The "fixed voltage" is preferably circuit ground, and is referred to as such herein, though another fixed potential may be used in some applications.

MRZ clock signal CK2 is preferably arranged to toggle in synchronization with CK1 at a frequency $f_{MRZ}$, where $f_{MRZ}=N*f_{DATA}$ and N is a positive integer, such that the currents applied to intermediate nodes 56, 58 are connected to analog outputs 42, 44 when CK2 is low, and disconnected from the analog outputs when CK2 is high, such that switching noise that arises when CK1 is asserted is prevented from appearing on the analog outputs.

In the exemplary embodiment shown in FIG. 2b, MRZ circuit 60 comprises transistors 60a and 60b, and MRZ circuit 62 comprises transistors 62a and 62b, with transistors 60b and 62a driven by CK2, and transistors 60a and 62b driven by $V_{bias}$. The DAC is arranged such that CK2 toggles above and below $V_{bias}$. When CK2 toggles below $V_{bias}$, transistors 60b and 62a turn off and transistors 60a and 62b turn on and direct current from the intermediate nodes to the analog output lines. When CK2 toggles above $V_{bias}$, transistors 60a and 62b turn off and transistors 60b and 62a turn on and direct current from the intermediate nodes to circuit ground.

Figure 3A:
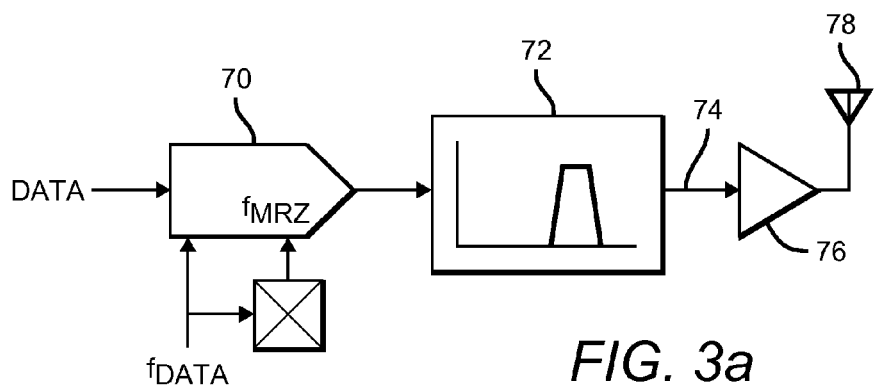
FIG. 3a is a block/schematic diagram of an RF signal generation system which includes an MRZ current switching DAC per the present invention.

A DAC as described above may be suitably employed to generate RF signals directly, as illustrated in FIG. 3a. As discussed above, the DAC 70 receives first and second clocks that operate at $f_{DATA}$ and $f_{MRZ}$, respectively; to maintain good dynamic range, $f_{MRZ}$ is preferably an integer multiple of $f_{DATA}$. By using a second clock to drive the MRZ switches, and having its frequency be a multiple of the data clock, the DAC output is shaped to have multiples of the MRZ waveform within one clock data period. The envelope of the DAC output spectrum follows the MRZ pulse's spectral characteristic. Since the MRZ spectrum's peak power occurs at $f_{MRZ}$, the DAC output exhibits peak power near $f_{MRZ}$.

The output of DAC 70 is preferably fed to a bandpass filter 72, with the filtered output 74 delivered to a transmitter 76 and antenna 78 for transmission. The present DAC provides usable output at higher-order Nyquist bands, while maintaining dynamic range. With this DAC, RF waveform generation is a simple matter of which Nyquist band to choose from the DAC output. The quality of the MRZ clock (CK 2) remains critical, but the noise characteristic of the data clock (CK1) is no longer important. Typical signal power and spurious free dynamic range (SFDR) plots vs. $f_{DATA}$ are shown in FIGS. 3b and 3c, respectively. The output spectrum can be shaped to obtain peak power at high RF frequencies by choosing integer N such that the DAC's output power is relatively high within a desired frequency range.

There are numerous advantages to the present DAC. The described arrangement provides a very simple transmit chain, with modest size/weight and power requirements. The digital circuitry operates at the message data rate ($f_{DATA}$), rather than at RF. However, message bandwidth should be limited to no more than about ⅓ of $f_{DATA}$, and thus the present system may not be suited to broadband communication.

A more detailed look at the operation of the present DAC is shown in FIG. 4. The DAC is modeled as an ideal sampler block 80 and a zero-order hold block 82 which performs DAC pulse-shaping. Time domain waveforms 84, 86 and frequency spectrum plots 88, 90 are shown for the output of each block. At the output of ideal sampler block 80, the DAC spectrum 88 repeats in frequency. However, at the output of zero-order hold block 82, the output spectrum 90 is shaped by the DAC pulse spectrum.

Figure 5A:
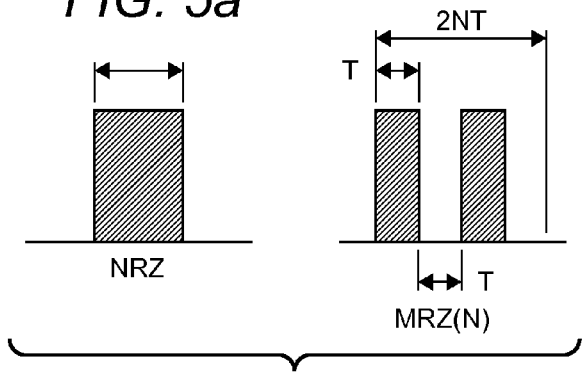
FIG. 5a depicts various DAC output pulse shapes.
Figure 5B:
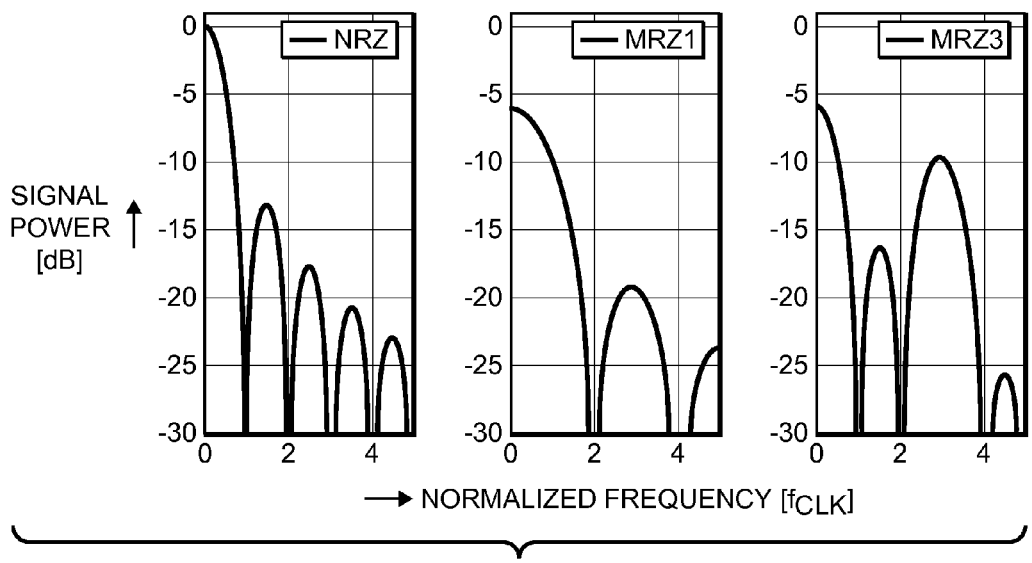
FIG. 5b plots signal power vs. normalized frequency for several DAC output pulse shapes.

Additional comparisons are shown in FIGS. 5a and 5b. Non-return-to-zero (NRZ) and MRZ output pulse shapes are shown in FIG. 5a, and signal power vs. normalized frequency plots are shown in FIG. 5b for the NRZ case, as well as MRZ cases with N=1 and 3.

As noted above, the operation of a DAC is typically modeled by a sampler followed by a zero-order holder. Because of the sampling operation, the DAC spectrum repeats in the frequency domain, and the zero-order hold function causes the DAC spectrum to exhibit a spectral amplitude modulation given by:

$$H_{RZ,n}(f) = e^{-j\pi f n T} nT \sin c(nfT) \quad \text{(Eq. 1)}$$

where T is the data clock period and n is the duty cycle of the DAC output pulse.

Figure 6A:
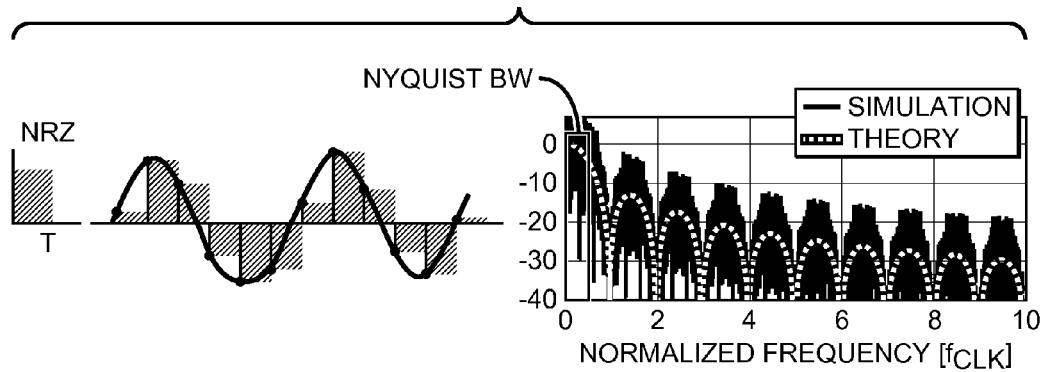
FIGS. 6a-6d depict DAC output waveforms and corresponding frequency spectrums for several DAC output pulse shapes.
Figure 6B:
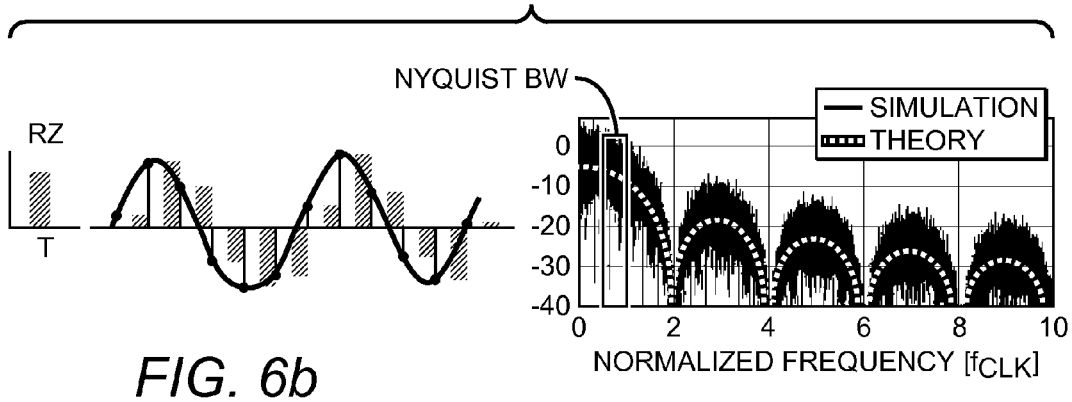
Figure 6C:
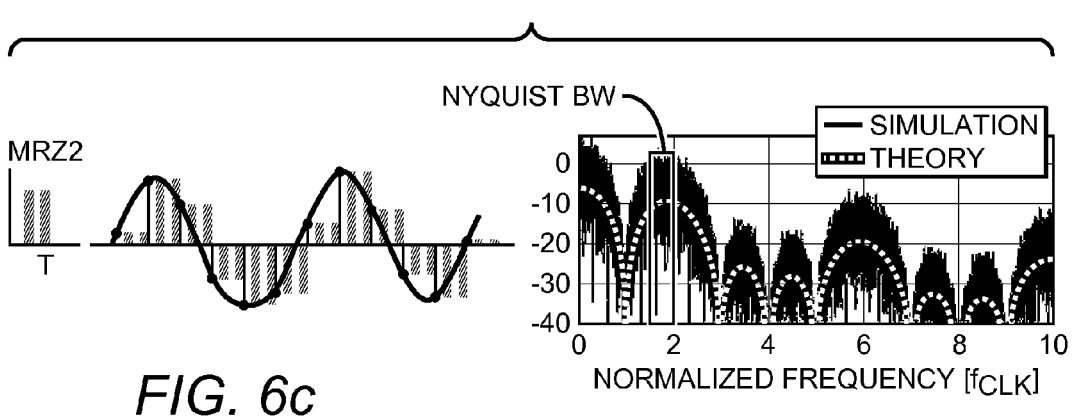
Figure 6D:
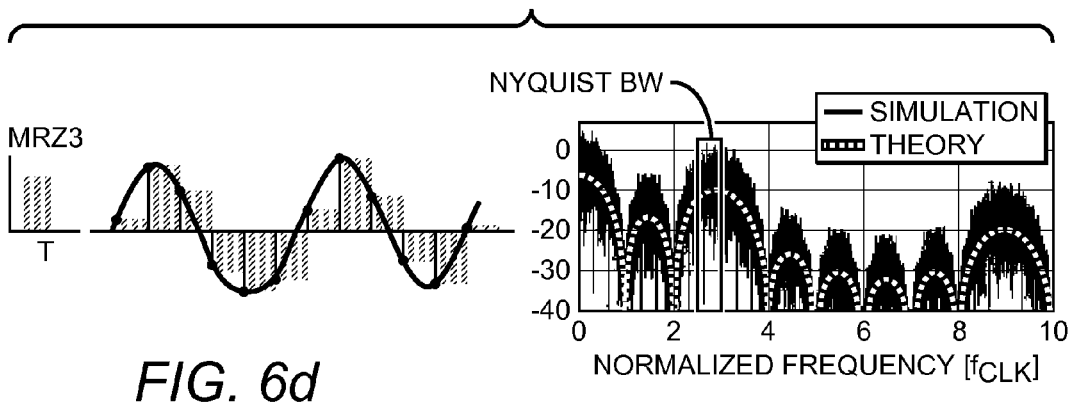

FIGS. 6a-6d depict DAC output waveforms and spectral density plots for NRZ, RZ, MRZ2 (N=2), and MRZ3 (N=3) DACs. The NRZ waveform shown in FIG. 6a is a special case of a return-to-zero (RZ) waveform (FIG. 6b), with n=1. When the DAC output has a 50% duty cycle as shown in FIG. 6a, the spectrum has nulls at even multiples of clock frequency in the corresponding spectral density plot. However, if the DAC is an MRZ DAC as shown in FIGS. 6c and 6d, it can be shown that the DAC output spectrum is given by:

$$H_{MRZ}(f) = H_{RZ}(f) e^{-j2\pi f(N-1)T} \frac{\sin(2\pi f NT)}{\sin(2\pi f T)}. \quad \text{(Eq. 2)}$$

Compared to the NRZ waveform, the RZ waveforms have 6 dB less power at DC; however the frequency response within one Nyquist band (which corresponds to 0.5 in x-axis) is more uniform and offers more power at high frequency.

In addition to the signal power advantages, other performance benefits are realized by implementing the DAC with MRZ switches. As noted above, the input dependent output glitch during data switching that degrades the SFDR performance is gated out, resulting in an improved dynamic linearity. Finite data rise/fall time causes distortion at high frequencies, but this is not the case with an MRZ DAC.

The MRZ switches are preferably embedded with the DAC current source switches. When so arranged, the MRZ switches consume no extra power and are inherently linear, because they operate as on-off current switches. High-order linearity degradation is small because the MRZ switch is distributed, and each MRZ switch only handles a small portion of the output signal. As explained above, during the reset phase, the DAC output current is preferably dumped to ground. The DAC output is connected to transistors with a fixed base bias; the fixed bias can be heavily bypassed, and output noise thereby reduced.

Figure 7A:
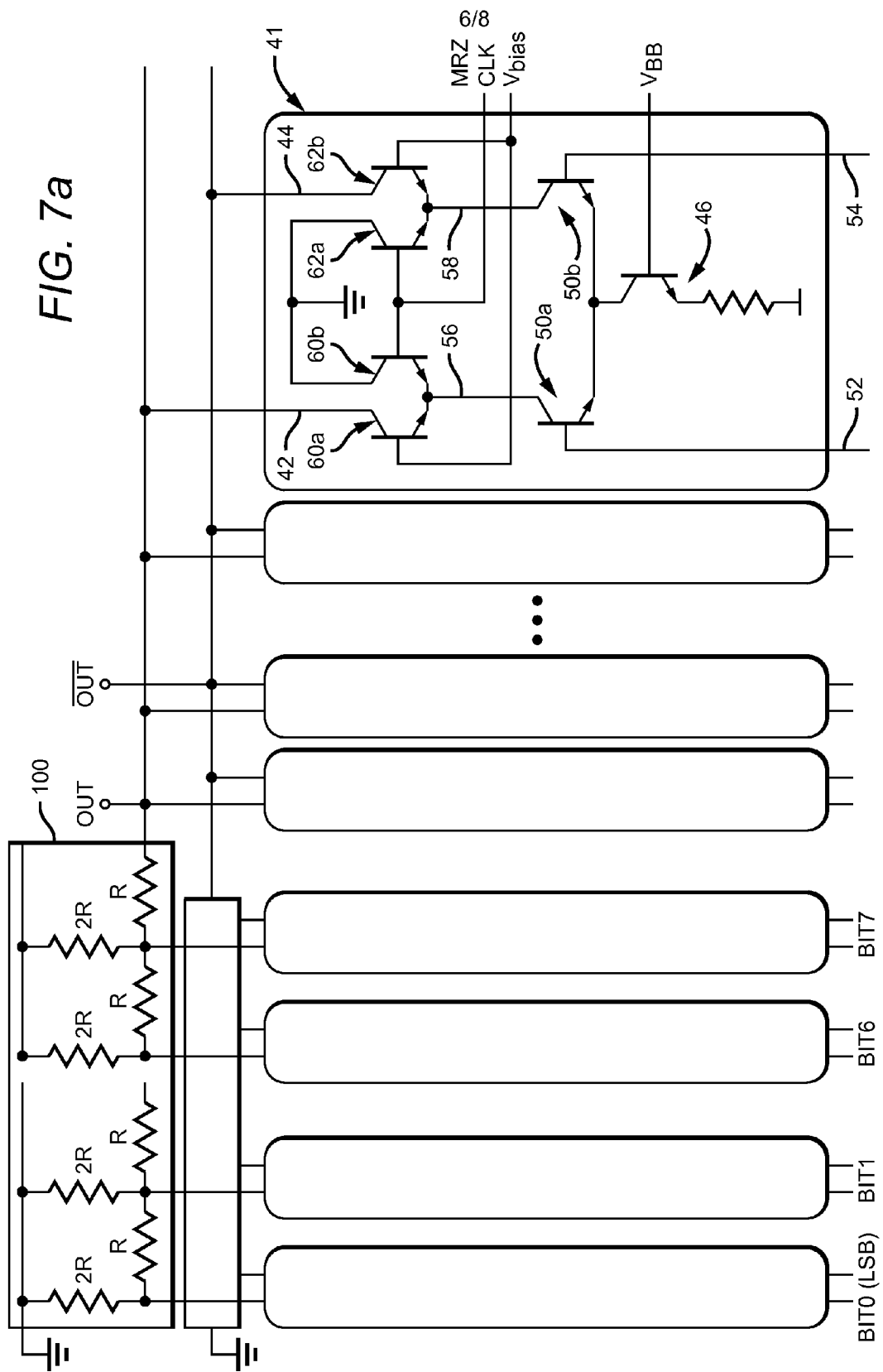
FIG. 7a is a block/schematic diagram of a differential embodiment of an MRZ current switching DAC per the present invention.

FIG. 7a illustrates one possible embodiment of a complete DAC in accordance with the present invention. Each bit requires current switching circuitry 41 as shown in FIG. 2b. MRZ switches (60, 62) are embedded inside the current switching circuitry, and the output is tapped out where the thermometer-coded MSB section meets the LSB section, with 8 bit attenuation scaling. Taking the output at this point minimizes the linearity error due to interconnection parasitics that might be present between the MSB current switching elements.

Figure 7B:
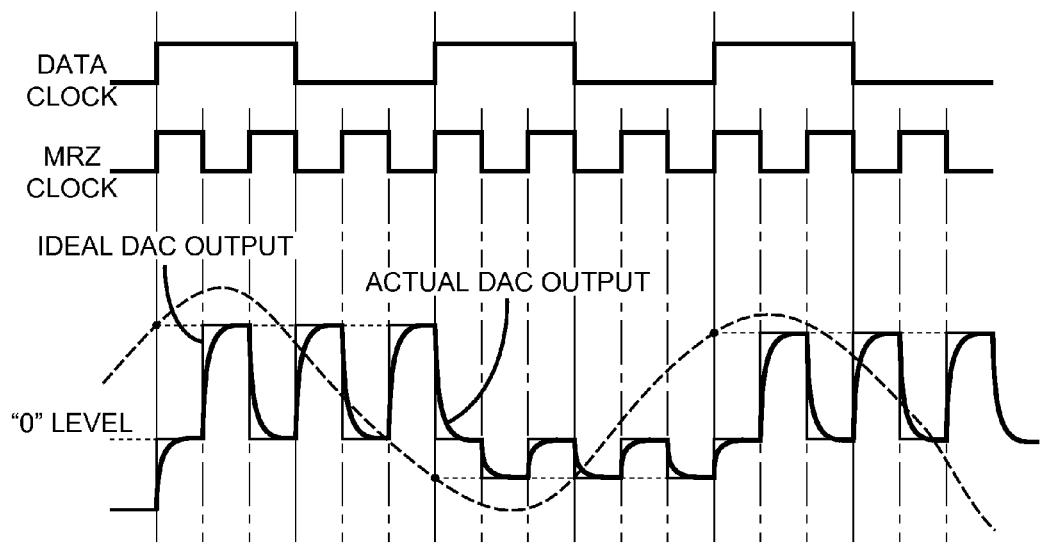

The operation of the DAC shown in FIG. 7a is illustrated with the timing diagram of FIG. 7b. When DATA CLOCK goes high, transistors 50a, 50b of the data current switch are closed in accordance with the digital word applied to the DAC's control signal inputs 52, 54, causing the voltages on at least some of intermediate nodes 56, 58 to change. As noted above, the MRZ CLOCK is preferably arranged to toggle in synchronization with DATA CLOCK at a frequency $f_{MRZ}$, where $f_{MRZ}=N*f_{DATA}$ and N is a positive integer, such that the currents applied to intermediate nodes 56, 58 are connected to analog outputs 42, 44 when MRZ CLOCK is low (MRZ CLOCK<Vbias), and disconnected from the analog outputs when MRZ CLOCK is high (MRZ CLOCK>Vbias), such that switching noise that arises when DATA CLOCK is asserted is prevented from appearing on the analog outputs.

As long as MRZ CLOCK is high and MRZ current switch transistors 60b, 62a are closed, none of the current source outputs are directed to analog output lines 42 and 44, and lines 42 and 44 are preferably pulled to a "zero" potential via an output network 100. FIG. 7b depicts both an ideal DAC output, and what an actual DAC output might look like.

Because RZ current switch transistors 60a, 62b are connected to a fixed voltage, clock noise that might otherwise be coupled to the analog output lines (as in prior art designs) is substantially reduced or eliminated. To ensure reliable operation of the MRZ current switches, the MRZ CLOCK signal when high should be at least 100 mV greater than Vbias, and when low should be at least 100 mV less than Vbias (for the NPN embodiment shown).

The MRZ current switch outputs are preferably coupled to analog output lines 42, 44 via an output network 90, which may comprise, for example, a R-2R ladder network (as shown in FIG. 7). Note that the use of a R-2R ladder network is not essential to the invention. For example, all the MRZ switch outputs could be coupled directly to an analog output line with a single resistor serving as a pull-up device.

The transistors driving the analog output lines are preferably high speed, low capacitance (high $f_T$) transistors, capable of handling a large voltage swing. As switching noise is coupled to the output, parasitic capacitance should be kept to a minimum, and a high-impedance substrate is recommended.

Figure 8A:
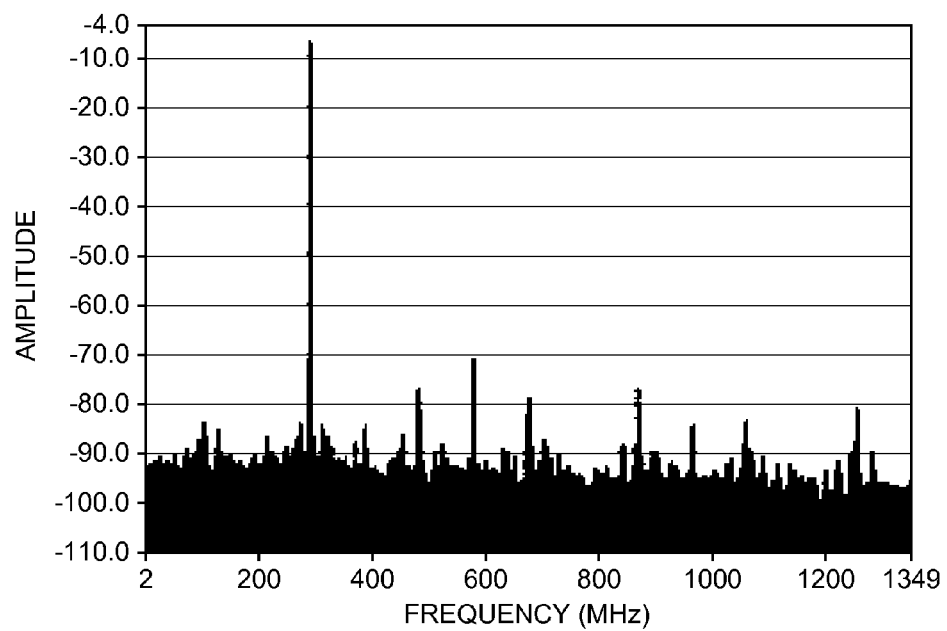
FIG. 8a is a spectrum capture in the first Nyquist band for an MRZ current switching DAC per the present invention.
Figure 8B:
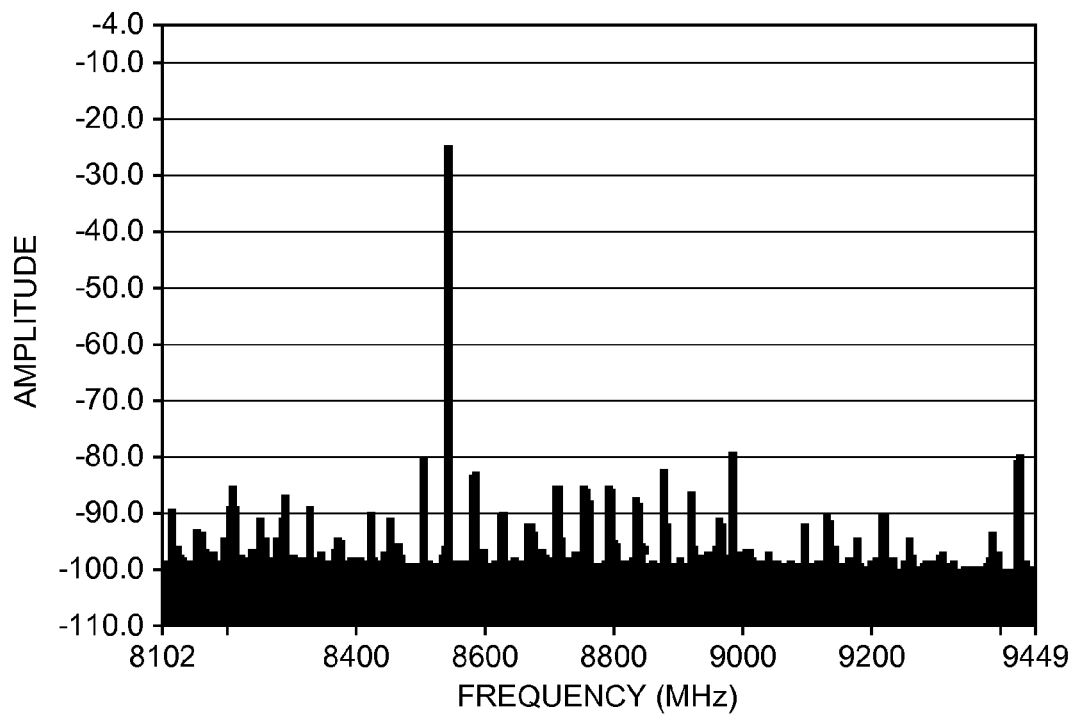
FIG. 8b is a spectrum capture in the 7$^{th}$ Nyquist band for an MRZ current switching DAC per the present invention.

A pair of typical captured output spectrums for a DAC using a 2.7 GHz data clock is shown in FIGS. 8a and 8b. In FIG. 8a, the spectrum capture is in the first Nyquist band (DC–1350 MHz), and in FIG. 8b, the spectrum capture is in the 7th Nyquist band (8100–9450 MHz). Measured SFDR is 65 dB and 55 dB c, respectively.

Figure 8C:
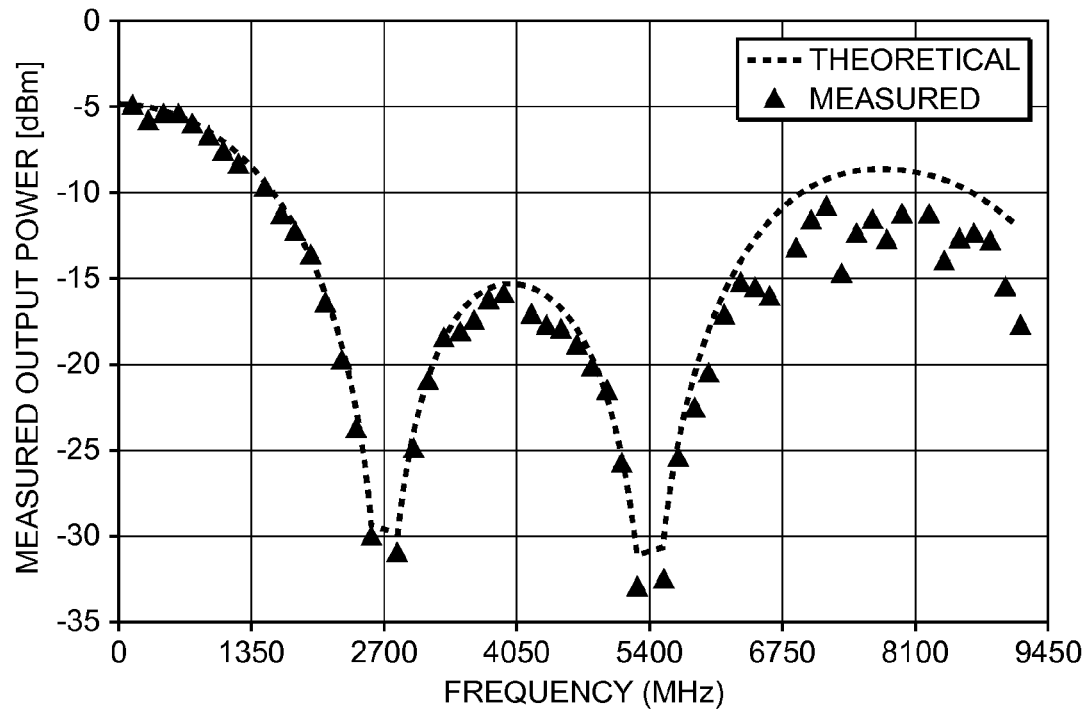
FIG. 8c is a plot of measured output power for an MRZ current switching DAC per the present invention.

The measured output power from the DAC is presented in FIG. 8c, with $f_{MRZ}=3\times f_{DATA}=8.1$ GHz. The theoretical output spectrum calculated by Eq. 2 (above) is plotted with a light dashed line. Attenuations of less than 5 dB at high frequency are measured, and the DAC provides ample signal power at 8 GHz. The signal power loss of the output cables and balun is measured as a function of frequency and calibrated in the plot.

The MRZ circuits are preferably integrated with the DAC's switched current sources, associated current switches, and control circuitry on a common substrate. The MRZ circuits are preferably implemented with the same type of transistors used for the current sources' current switches, making integration on a common substrate straightforward. This results in a current switching DAC which is simpler, consumes less power, and introduces less noise than more complex prior art approaches. For high frequency performance, the present DAC's transistors are preferably fabricated using Group III-V materials; indium-phosphorous (InP) HBTs are preferred, as InP HBTs are faster, less noisy, have a better breakdown voltage, and have the potential to achieve higher dynamic range with more signal power than silicon-based transistors.

The present invention is equally applicable to a current switching DAC having a single-ended analog output; in this case, one of the intermediate nodes connected to each of the current switches is preferably connected to ground. Though the embodiments shown depict the present DAC as implemented with NPN transistors, the invention is equally applicable to implementations employing PNP transistors, FETs, or various combinations of these. The concepts presented herein could also be employed with RZ DAC architectures other than those shown in the accompanying drawings.

While particular embodiments of the invention have been shown and described, numerous variations and alternate embodiments will occur to those skilled in the art. Accordingly, it is intended that the invention be limited only in terms of the appended claims.

We claim:

1. A current switching digital-to-analog converter (DAC), comprising:
an analog output which provides said DAC's analog output voltage;
a digital input which receives a plurality of digital bits representative of a desired analog output voltage;
a first clock signal CK1 having an associated frequency $f_{CK1}$;
a plurality of current sources having respective output currents which are selectively directed to respective intermediate nodes in response to respective control signals, the states of said control signals varying with said digital bits and changing states in synchronization with CK1;
a plurality of multiple return-to-zero (MRZ) current switch circuits connected between respective intermediate nodes and said analog output, said MRZ current switch circuits driven with a second clock signal CK2, such that said output currents applied to said intermediate nodes are connected to said analog output when CK2 is low and disconnected from said analog output and connected to a fixed voltage when CK2 is high, each of said MRZ current switch circuits arranged to connect a respective one of said intermediate nodes to said fixed voltage multiple times during every switching cycle of CK1 such that switching noise that arises when CK1 is asserted is prevented from appearing on said analog output.

2. The DAC of claim 1, wherein said DAC is arranged to generate a direct digital waveform at RF frequencies.

3. The DAC of claim 2, wherein said RF frequencies are within a known frequency range.

4. The DAC of claim 1, wherein said second clock signal CK2 is arranged to toggle in synchronization with CK1 and has an associated frequency $f_{CK2}$, where $f_{CK2}=N*f_{CK1}$ and N is a positive integer.

5. The DAC of claim 4, wherein said integer N are chosen to produce an output spectrum for said DAC such that said DAC's output power is relatively high within said known frequency range.

6. A current switching digital-to-analog converter (DAC), comprising:
an analog output;
a digital input which receives a plurality of digital bits representative of a desired analog output voltage;
a first clock signal CK1;
a plurality of current sources having respective output currents which are selectively directed to respective intermediate nodes in response to respective control signals, the states of said control signals varying with said digital bits and changing states in synchronization with said first clock signal having an associated frequency $f_{CK1}$;
a plurality of multiple return-to-zero (MRZ) current switch circuits connected between respective intermediate nodes and said analog output, each of said MRZ current switch circuits comprising:
a first transistor connected between the intermediate node and said analog output and driven with a fixed bias voltage $V_{bias}$, and
a second transistor connected between the intermediate node and a second fixed voltage and driven with a second clock signal CK2 having an associated frequency $f_{CK2}$, where $f_{CK2}=N*f_{CK1}$, wherein N is a positive integer;
said DAC arranged such that, when CK2 toggles below $V_{bias}$, said second transistor turns off and said first transistor turns on and directs the output current applied to said intermediate node to said analog output, and when CK2 toggles above $V_{bias}$, said first transistor turns off and said second transistor turns on and directs the output current applied to said intermediate node to said fixed voltage, such that each of said MRZ current switch circuits connects a respective one of said intermediate nodes to said fixed voltage N times during every switching cycle of CK1.

7. The DAC of claim 6, wherein CK2 toggles in synchronization with CK1 such that each of said MRZ current switch circuits directs a current applied to a respective one of said intermediate nodes to said fixed voltage in synchronization with CK1, thereby preventing switching noise that arises when CK1 is asserted from appearing on said analog output.

8. The DAC of claim 5, further comprising an output network coupled to said analog output, said output network comprising a R-2R ladder network.

9. The DAC of claim 6, wherein said analog output is a differential output comprising first and second analog output lines, each of said MRZ current switch circuits arranged to direct a current applied to a respective one of said intermediate nodes to said second fixed voltage or to one of said first and second output lines in response to said second clock signal.

10. The DAC of claim 6, wherein said positive integer N is 2 or 3.

11. The DAC of claim 6, wherein the outputs of said plurality of current sources are selectively directed to respective intermediate nodes via respective data current switches, each of which has a current input, two current outputs, and two control signal inputs, and is arranged to direct a current applied to its current input to one or the other of its two current outputs in response to control signals applied to said control signal inputs, the current input of each data current switch connected to a respective current source output current, the current outputs of each data current switch connected to respective intermediate nodes, and the control signal inputs of each data current switch connected to a respective one of said control signals.

12. The DAC of claim 11, wherein each of said data current switches comprises first and second bipolar transistors having their emitters connected to said current input, their collectors connected to respective ones of said current outputs, and their bases connected to respective ones of said control signal inputs.

13. The DAC of claim 11, wherein each of said data current switches comprises first and second field-effect transistors (FETs) having their sources connected to said current input, their drains connected to respective ones of said current outputs, and their gates connected to respective ones of said control signal inputs.

14. The DAC of claim 11, wherein said current sources, said data current switches, and said MRZ current switch circuits are integrated together on a common substrate.

15. The DAC of claim 6, wherein said analog output comprises a single output line and wherein one of the intermediate nodes connected to each of said data current switches is connected to ground.

16. The DAC of claim 6, wherein each of said first and second transistors are bipolar transistors having their bases connected to $V_{bias}$ and CK2, respectively, their emitters connected to said intermediate node, and their collectors connected to said analog output and said fixed voltage, respectively.

17. The DAC of claim 6, wherein each of said first and second transistors are field-effect transistors (FETs) having their gates connected to $V_{bias}$ and CK2, respectively, their sources connected to said intermediate node, and their drains connected to said analog output and said fixed voltage, respectively.

18. The DAC of claim 6, wherein said current sources and MRZ current switch circuits are integrated together on a common substrate.

19. The DAC of claim 6, wherein said fixed voltage is circuit ground.

20. The DAC of claim 6, further comprising a plurality of latches connected to receive said plurality of digital bits received at said digital input and arranged to latch said digital bits in response to said first clock signal CK1.

21. The DAC of claim 6, wherein said DAC is arranged to generate a direct digital waveform at RF frequencies.

22. The DAC of claim 21, wherein said RF frequencies are within a known frequency range, said integer N chosen to produce an output spectrum for said DAC such that said DAC's output power is relatively high within said known frequency range.

23. A current switching digital-to-analog converter (DAC), comprising:
 a differential analog output;
 a digital input which receives a plurality of digital bits representative of a desired analog output voltage, the states of said digital bits changing in synchronization with a first clock signal CK1 having an associated frequency $f_{CK1}$;
 a plurality of differential current sources, each of which receives a respective one of said digital bits and has complementary outputs, the states of which vary with the value of said digital bit;
 a plurality of multiple return-to-zero (MRZ) current switch circuits, each of which is connected between a respective one of said complementary outputs and said differential analog output, each of said MRZ current switch circuits comprising:
  a first transistor connected between said complementary output and said analog output and driven with a second clock signal CK2 which toggles in synchronization with CK1 and has an associated frequency $f_{CK2}$, where $f_{CK2}=N*f_{CK1}$, wherein N is a positive integer; and
  a second transistor connected between said complementary output and a fixed voltage and driven with the inverse of said second clock signal $\overline{CK2}$;
 said DAC arranged such that, when $\overline{CK2}$ toggles low, said second transistor turns off and said first transistor turns on and directs current to said analog output, and when $\overline{CK2}$ toggles high, said first transistor turns off and said second transistor turns on and directs current to said fixed voltage, such that each of said MRZ current switch circuits connects a respective one of said complementary nodes to said fixed voltage N times during every switching cycle of CK1;
 such that switching noise that arises when CK1 is asserted is prevented from appearing on said analog output.

24. The DAC of claim 23, wherein said DAC is arranged to generate a direct digital waveform at RF frequencies.

25. The DAC of claim 24, wherein said RF frequencies are within a known frequency range, said integer N chosen to produce an output spectrum for said DAC such that said DAC's output power is relatively high within said known frequency range.

* * * * *